United States Patent
Wong et al.

(10) Patent No.: US 8,624,296 B1
(45) Date of Patent: Jan. 7, 2014

(54) HIGH ELECTRON MOBILITY TRANSISTOR INCLUDING AN EMBEDDED FLOURINE REGION

(75) Inventors: King-Yuen Wong, Tuen Mun (HK); Chen-Ju Yu, Jiaoxi Township (TW); Fu-Wei Yao, Hsin-Chu (TW); Jiun-Lei Jerry Yu, Zhudong Township (TW); Po-Chih Chen, Hsin-Chu (TW); Fu-Chih Yang, Fengshan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/571,136

(22) Filed: Aug. 9, 2012

(51) Int. Cl.
*H01L 29/66* (2006.01)
*H01L 29/15* (2006.01)

(52) U.S. Cl.
USPC ............. 257/194; 257/76; 257/E21.403

(58) Field of Classification Search
USPC ............ 257/76, 77, 194, E21.403, E29.246, 257/E29.091
See application file for complete search history.

(56) References Cited

U.S. PATENT DOCUMENTS

2007/0224710 A1* 9/2007 Palacios et al. ............... 438/12
2011/0018002 A1* 1/2011 Chen et al. ................... 257/76

OTHER PUBLICATIONS

Cai, Y., et al., "High-Performance Enhancement-Mode AlGaN/GaN HEMTs Using Fluoride-Based Plasma Treatment," IEEE Electron Device Letters, vol. 26, No. 7, Jul. 2005, pp. 435-437.
Chen, H., et al., "Enhancement-mode AlGaN/GaN HEMTs Frabricated by Standard Fluorine Ion Implantation," Dept. of Electronic and Computer Engineering, Hong Kong University of Science and Technology, Hong Kong, CS Mantech Conference, May 17-20, 2010, pp. 145-148.
Fellows, J., et al., "Electrical activation studies of GaN implanted with Si from low to high dose," Applied Physics Letter, vol. 80, No. 11, Mar. 18, 2002, pp. 1930-1932.
Imada, T., et al., "Enhancement-Mode GaN MIS-HEMTs for Power Supplies," The 2010 International Power Electronics Conference, 7 pages.
Tsai, M., et al., "Improving Light Output Power of the GaN-Based Vertical-Injection Light-Emitting Diodes by Mg+ Implanted Current Blocking Layer," IEEE Photonics Technology Letters, vol. 21, No. 11, Jun. 1, 2009, pp. 688-690.

* cited by examiner

*Primary Examiner* — Selim Ahmed
(74) *Attorney, Agent, or Firm* — Slater & Matsil, L.L.P.

(57) ABSTRACT

A semiconductor structure includes a first III-V compound layer. A second III-V compound layer is disposed on the first III-V compound layer and is different from the first III-V compound layer in composition. The second III-V compound layer has a top surface. A source feature and a drain feature are disposed on the second III-V compound layer. A gate electrode is disposed over the second III-V compound layer between the source feature and the drain feature. A fluorine region is embedded in the second III-V compound layer under the gate electrode. The fluorine region has a top surface lower than the top surface of the second III-V compound layer. A gate dielectric layer is disposed under at least a portion of the gate electrode and over the fluorine region.

18 Claims, 8 Drawing Sheets

HIGH ELECTRON MOBILITY TRANSISTOR INCLUDING AN EMBEDDED FLOURINE REGION

RELATED APPLICATIONS

This application is related to commonly owned and co-pending patent application Ser. No. 13/571,169, filed on Aug. 9, 2012 and entitled "High Electron Mobility Transistor and Method of Forming the Same,", which application is incorporated herein by reference.

TECHNICAL FIELD

This disclosure relates generally to a semiconductor structure and, more particularly, to a high electron mobility transistor (HEMT) and method for forming a high electron mobility transistor.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility, the ability to transmit signals at high frequencies, etc.

From an application point of view, enhancement-mode (E-mode) HEMTs have many advantages. E-mode HEMTs allow elimination of negative-polarity voltage supply, and, therefore, reduction of the circuit complexity and cost. Despite the attractive properties noted above, a number of challenges exist in connection with developing III-V semiconductor compound-based devices. Various techniques directed at configurations and materials of these III-V semiconductor compounds have been implemented to try and further improve transistor device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a semiconductor structure includes a high electron mobility transistor (HEMT). The HEMT includes a heterojunction formed between two different semiconductor material layers, such as material layers with different band gaps. In at least one embodiment, the HEMT includes a first III-V compound layer (also referred to as a channel layer) formed on a substrate and a second III-V compound layer (also referred to as a donor-supply layer) formed on the channel layer. The channel layer and the donor-supply layer are compounds made from the III-V groups in the periodic table of elements. However, the channel layer and the donor-supply layer are different from each other in composition. The first III-V compound layer is undoped or unintentionally doped (UID). The second III-V compound layer is intentionally doped.

The band gap discontinuity exists between the second III-V compound layer and the first III-V compound layer. The electrons from a piezoelectric effect in the second III-V compound layer drop into the first III-V compound layer, creating a very thin layer of highly mobile conducting electrons in the first III-V compound layer. This thin layer is referred to as a two-dimensional electron gas (2-DEG), forming a carrier channel. The carrier channel of 2-DEG is located at the first III-V compound layer near an interface of the second III-V compound layer and the first III-V compound layer. Thus, the carrier channel has high electron mobility because the first II-V compound layer is undoped or unintentionally doped, and the electrons can move freely without collision or with substantially reduced collisions with impurities.

According to one or more embodiments of this disclosure, the semiconductor structure is formed within a chip region of the substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to the bulk substrate on which various layers and device structures are formed. In some embodiments, the bulk substrate includes silicon or a compound semiconductor, such as GaAs, InP, Si/Ge, or SiC. Examples of such layers include dielectric layers, doped layers, polysilicon layers or conductive layers. Examples of device structures include transistors, resistors, and/or capacitors, which may be interconnected through an interconnect layer to additional integrated circuits.

Figure 1:
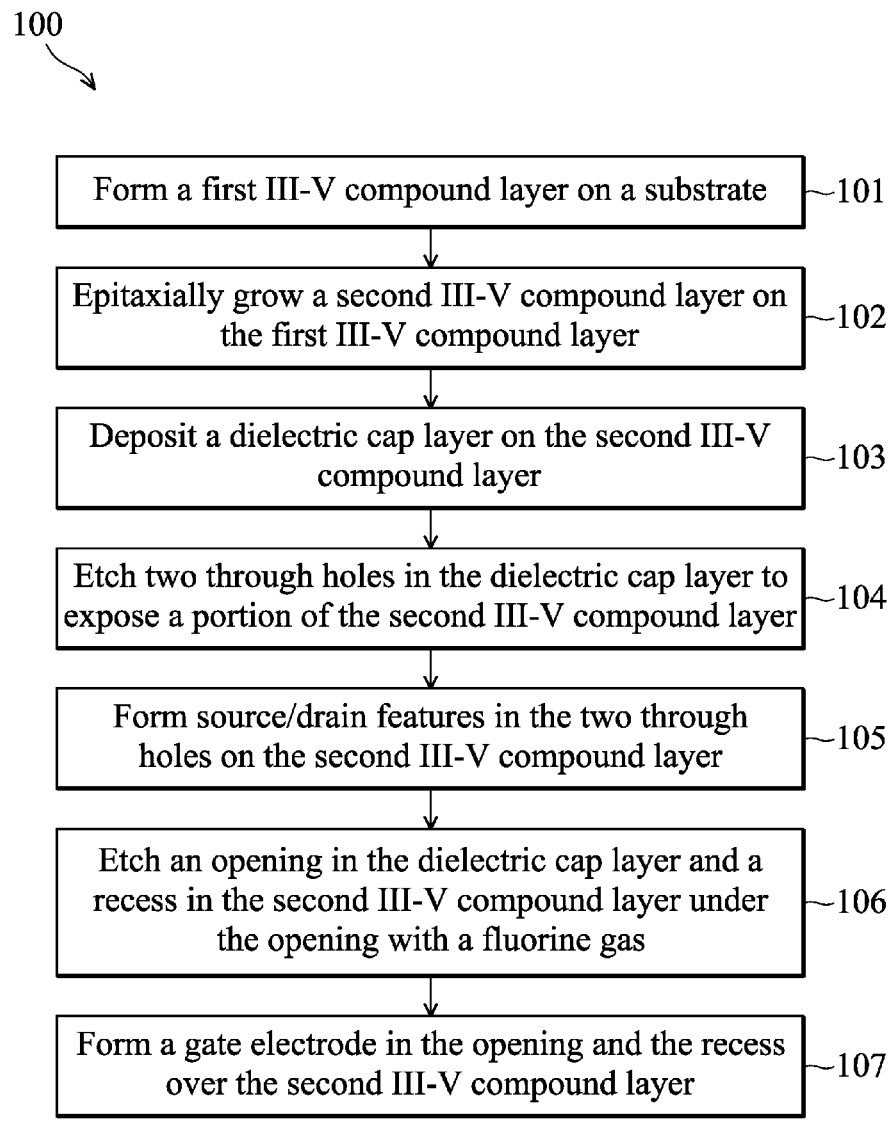
FIG. 1 is a flowchart of a method of forming a semiconductor structure having a HEMT according to one or more embodiments of this disclosure.

FIG. 1 is a flowchart of a method 100 of forming a semiconductor structure having a HEMT according to one or more embodiments of this disclosure. Referring now to FIG. 1, the flowchart of the method 100, at operation 101, a first III-V compound layer is provided. The first III-V compound layer is formed on a substrate. Next, the method 100 continues with operation 102 in which a second III-V compound layer is epitaxially grown on the first III-V compound layer. The method 100 continues with operation 103 in which a dielectric cap layer is deposited over the second III-V compound layer. The method 100 continues with operation 104 in which two through holes are etched in the dielectric cap layer to expose a portion of the second III-V compound layer. The method 100 continues with operation 105 in which a source feature and a drain feature are formed in the two through holes respectively on the second III-V compound layer. The method 100 continues with operation 106 in which an opening in the dielectric cap layer and a recess of the second III-V compound layer under the opening are etched with a fluorine gas. The method 100 continues with operation 107 a gate electrode is formed in the opening and the recess over the second III-V compound layer. It should be noted that additional processes may be provided before, during, or after the method 100 of FIG. 1.

FIGS. 2A to 2G are cross-sectional views of a semiconductor structure 200 having a HEMT at various stages of manufacture according to various embodiments of the method 100 of FIG. 1. Various figures have been simplified for a better understanding of the inventive concepts of the present disclosure.

Figure 2A:
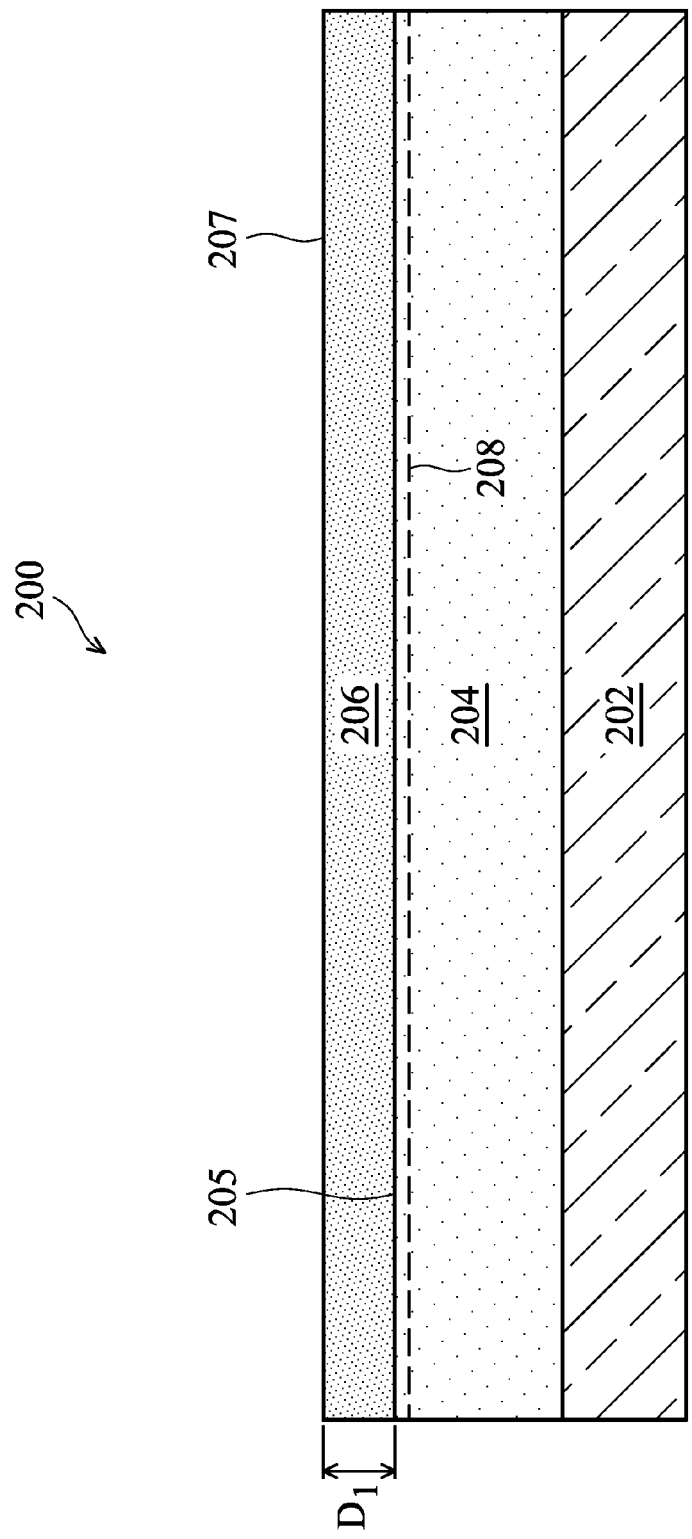
FIGS. 2A to 2G are cross-sectional views of a semiconductor structure having a HEMT at various stages of manufacture according to one embodiment of the method of FIG. 1.

Referring to FIG. 2A, which is an enlarged cross-sectional view of a portion of a substrate 202 of a semiconductor structure 200 after performing operations 101 and 102. In some embodiments, the substrate 202 includes a silicon carbide (SiC) substrate, sapphire substrate or a silicon substrate. A first III-V compound layer 204, also referred to as a channel layer, is grown on the substrate 202. In the embodiment of FIGS. 2A-2G, the first III-V compound layer 204 refers to a gallium nitride (GaN) layer (also referred to as the GaN layer 204). The GaN layer 204 can be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. The GaN layer 204 is undoped. Alternatively, the GaN layer 204 is unintentionally doped, such as lightly doped with n-type dopants due to a precursor used to form the GaN layer 204. In the embodiment of FIGS. 2A-2G, the GaN layer 204 has a thickness in a range from about 0.5 micron to about 10 microns. In other embodiments, the first III-V compound layer 204 may include a GaAs layer or InP layer.

A second III-V compound layer 206, also referred to as donor-supply layer, is grown on first III-V compound layer 204. An interface 205 is defined between the first III-V compound layer 204 and the second III-V compound layer 206. A carrier channel 208 of 2-DEG is located at the first III-V compound layer 204 near the interface 205. In at least one embodiment, the second III-V compound layer 206 refers to an aluminum gallium nitride (AlGaN) layer (also referred to as the AlGaN layer 206). In the embodiment of FIGS. 2-8, the AlGaN layer 206 is epitaxially grown on the GaN layer 204 by MOVPE using aluminum-containing precursor, gallium-containing precursor, and nitrogen-containing precursor. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical. In the embodiment of FIGS. 2-8, the AlGaN layer 206 has a thickness $D_1$ in a range from about 5 nanometers to about 50 nanometers. The AlGaN layer 206 is intentionally doped. In other embodiments, the second III-V compound layer 206 may include an AlGaAs layer, or AlInP layer.

Figure 2B:
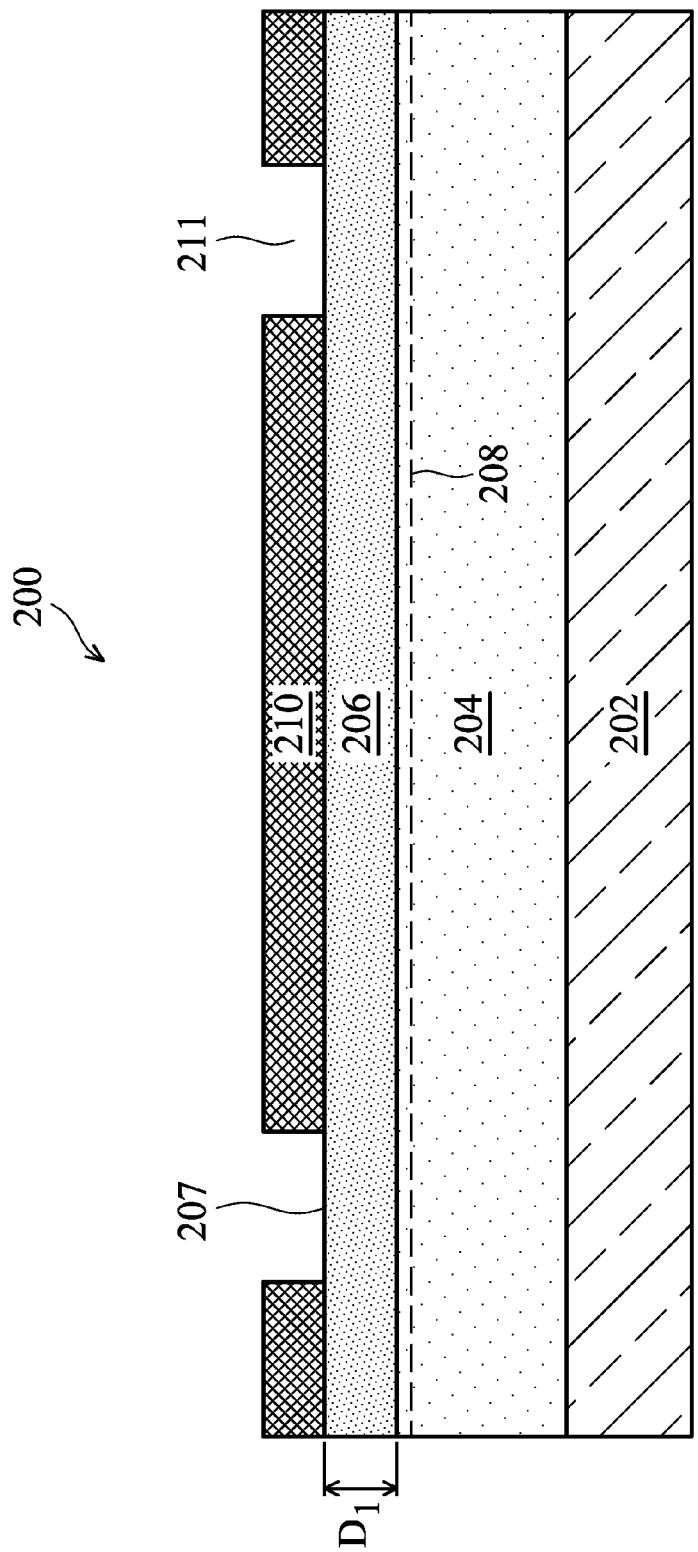

Referring back to FIG. 1, method 100 continues with operations 103 and 104. FIG. 2B illustrates a cross-sectional view of the semiconductor structure 200 after etching two through holes 211 in a dielectric cap layer 210 to expose a portion of the second III-V compound layer 206.

In FIG. 2B, the dielectric cap layer 210 is deposited on a top surface 207 of the second III-V compound layer 206. In the embodiment of FIGS. 2A-2G, the dielectric cap layer 210 has a thickness in a range from about 100 Å to about 5000 Å. In some embodiments, the dielectric cap layer 210 includes silicon oxide or silicon nitride. In one example, the dielectric cap layer 210 is silicon nitride which is formed by performing a low pressure chemical vapor deposition (LPCVD) method without plasma using $SiH_4$ and $NH_3$ gases. An operation temperature is in a range of from about 650° C. to about 800° C. An operation pressure is in a range of about 0.1 Torr and about 1 Ton. The dielectric cap layer 210 protects the underlying second III-V compound layer 206 from damage in the following processes having plasma environments.

Next, two through holes 211 in the dielectric cap layer 210 are defined by lithography and etching processes to expose a portion of a top surface 207 of the AlGaN layer 206. In one example, the dielectric cap layer 210 is silicon nitride and two openings 211 in silicon nitride are etched in a dry etching environment including $BCl_3$. A gas flow of $BCl_3$ is in a range of from about 30 sccm to about 60 sccm. An operation pressure is in a range of about 10 mTorr and about 50 mTorr. An operation power is in a range of about 100 W and about 200 W.

Figure 2C:
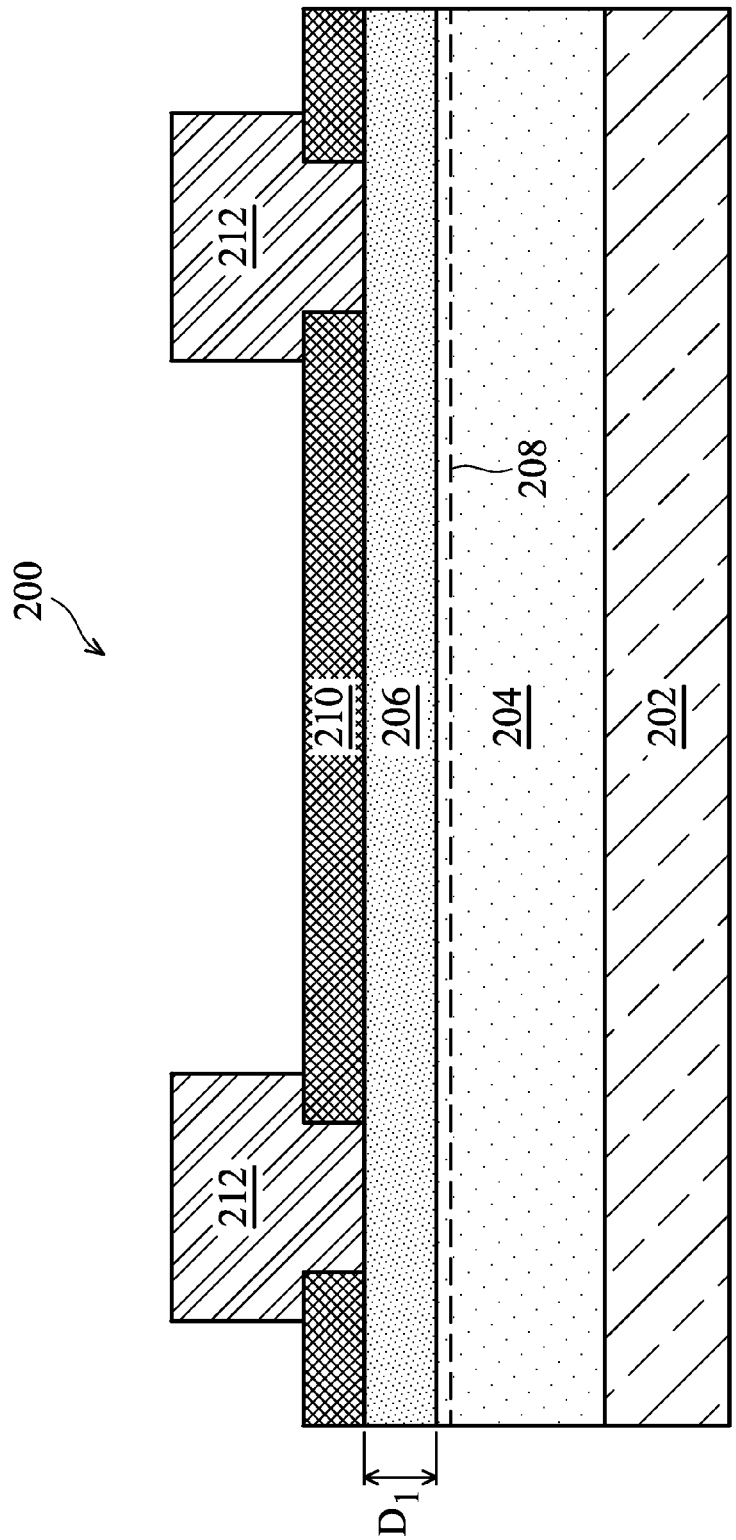

Referring back to FIG. 1, method 100 continues with operation 105. FIG. 2C illustrates a cross-sectional view of the semiconductor structure 200 after source/drain features 212 are formed in the two through holes 211 on the second III-V compound layer 206.

In FIG. 2C, a metal layer is deposited over the dielectric cap layer 210, overfilling the through holes 211 and contacting the second III-V compound layer 106. A photoresist layer (not shown) is formed over the metal layer and developed to form a feature over the through holes 211. The metal layer not covered by the feature of the photoresist layer is removed by a reactive ion etch (RIE) process that etches the exposed portions of the metal layer down to the underlying the dielectric cap layer 210. Metal features 212 are generated after the etching process. The metal features 212 are configured as the source feature or the drain feature for the HEMT. The photoresist layer is removed after the formation of the metal features 212. The dielectric cap layer 210 protects the underlying second III-V compound layer 206 from damage during the etching process to form metal features 212. The carriers in carrier channel 208 underlying the second III-V compound layer 206 would not be affected during the etching process. The electrical performances of the semiconductor structure 200 would be positively affected. Therefore, the yield of the overall assembly could increase.

In some embodiments, the metal layer of the metal features 212 includes one or more conductive materials. In at least one example, the metal layer is free of gold (Au) and comprises Ti, Co, Ni, W, Pt, Ta, Pd, Mo, TiN, or AlCu alloy. In another example, the metal layer includes a bottom Ti/TiN layer, an AlCu layer overlying the bottom Ti/TiN layer, and a top Ti layer overlying the AlCu layer. The formation methods of the metal layer include atomic layer deposition (ALD) or physical vapor deposition (PVD) processes. In at least one embodiment, a thermal annealing process may be applied to the metal features such that the metal features, the second III-V compound layer 206 and the first III-V compound layer 204 react to form an intermetallic compound. The intermetallic compound of the source/drain feature 212 provides for more effective electrical connection to the carrier channel 208. Although Au could be used for forming the metal features 212, by not using Au in the metal features 212, the method 100 could also be implemented in the production line of integrated circuits on silicon substrate. The contamination concern from Au on the silicon fabrication process could be eliminated.

Figure 2D:
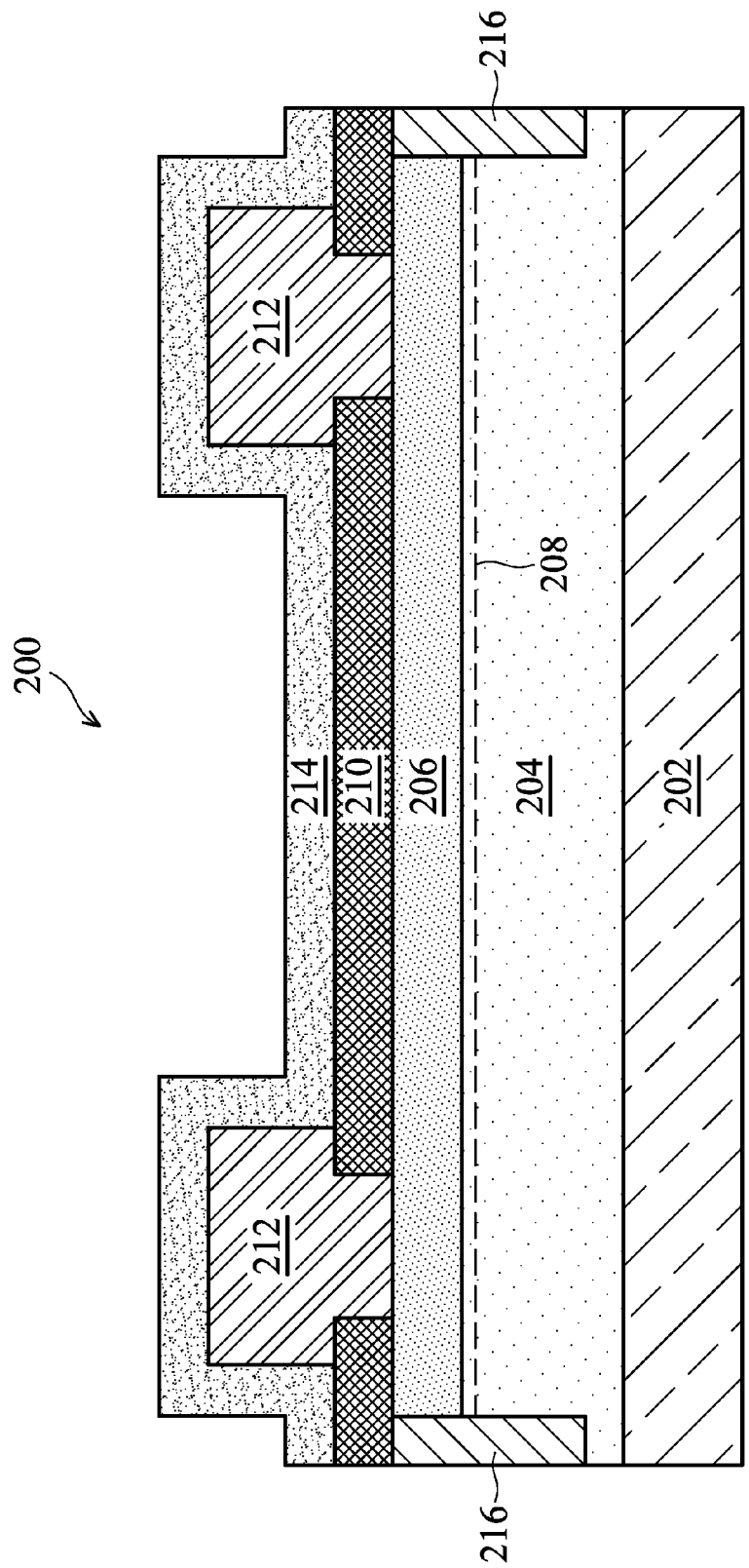

FIG. 2D illustrates a protection layer 214 is optionally deposited on top surfaces of the metal features 212 and the dielectric cap layer 210. In some embodiments, the protection layer 214 includes dielectric materials such as silicon oxide or silicon nitride. The protection layer 214 may be formed by a plasma enhanced chemical vapor deposition (PECVD) method.

After the formation of the protection layer 214, isolation regions 216 are formed in the first III-V compound layer 204 and the second III-V compound layer 206. The isolation regions 216 isolate the HEMT in the structure 200 from other devices in the substrate 202. In one example, the isolation region 216 is formed by an implantation process with species of oxygen or nitrogen. The protection layer 214 covers the source/drain features 212, and prevents the source/drain features 212 from exposure during an annealing process after the implantation process for the isolation region 216 formation.

Figure 2E:
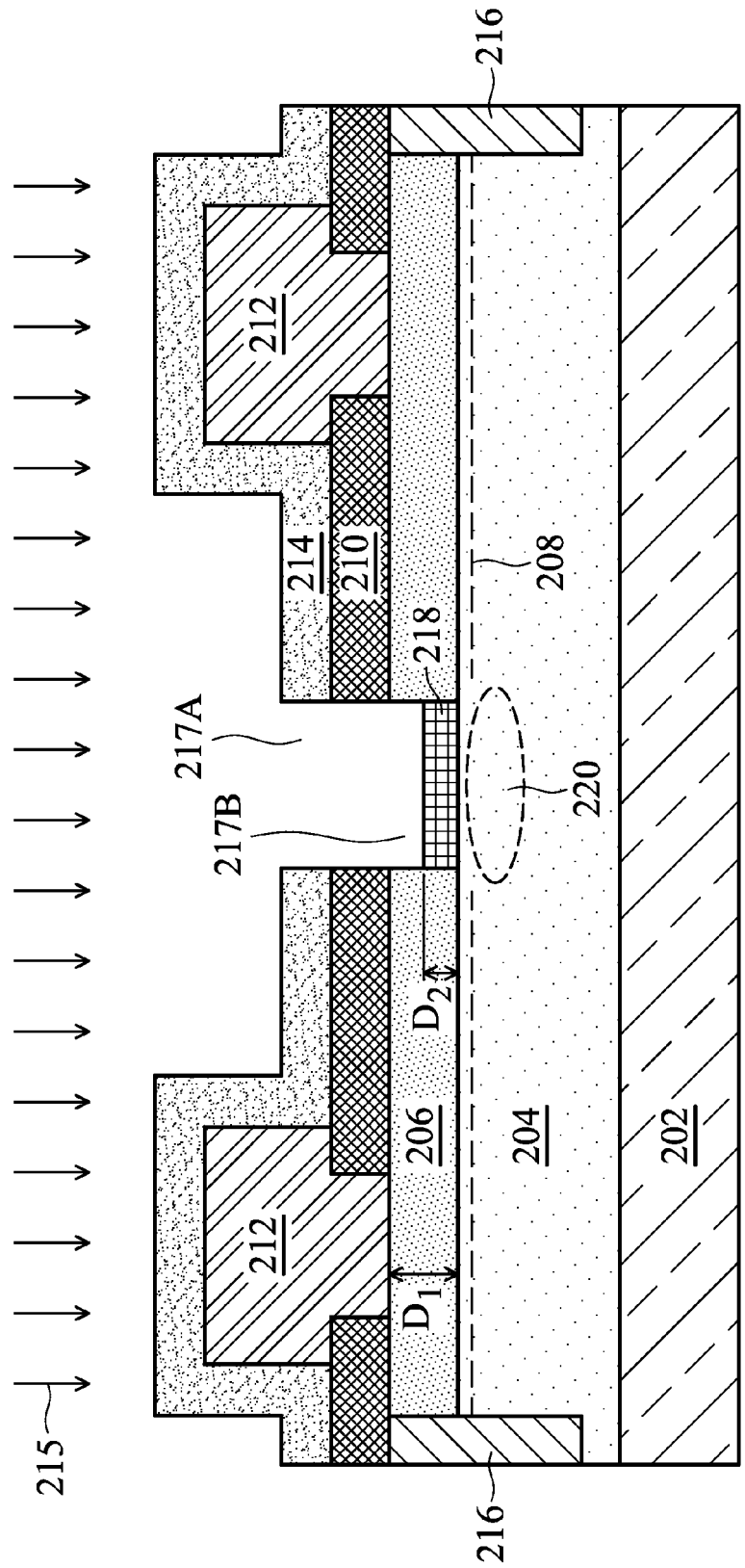

Referring back to FIG. 1, method 100 continues with operation 106. FIG. 2E illustrates a cross-sectional view of the semiconductor structure 200 after an opening 217A in the dielectric cap layer 210 and a recess 217B in the second III-V compound layer 206 under the opening 217A are formed by etching with a fluorine gas.

In FIG. 2E, the opening 217A is formed in the protection layer 214 and the dielectric cap layer 210 between the source/drain features 212. A patterned mask layer (not shown) is formed on a top surface of the protection layer 214 (also over the dielectric cap layer 210) and an etching process 215 is performed to remove a portion of the protection layer 214 and the dielectric cap layer 210. The same etching process 215 extends further below the top surface 107 to form a recess 217B in the second III-V compound layer 206 under the opening 217A. The opening 217A and the recess 217B are configured as a location for the later gate electrode formation.

In certain embodiments, the opening 217A and the recess 217B are etched in the same plasma etching process 215 including a fluorine gas. After defining the opening 217A in the protection layer 214 and the dielectric cap layer 210, the same plasma etching process 215 continues defining the recess 217B in the second III-V compound layer 206 in a same process chamber. The fluorine gas includes $SF_6$, $CF_4$ or $C_3F_8$. A gas flow of the fluorine gas is in a range of from about 10 sccm to about 100 sccm. As a result of the etching of the recess 217B, a fluorine region 218 is formed in the second III-V compound layer 206 under the opening 217A. The fluorine atoms in the fluorine region 218 may provide strong immobile negative charges and effectively deplete the electrons in the carrier channel 208. Hence, a depletion region 220 is created in the carrier channel 208. The carrier channel 208 becomes normally-off because of the depletion region 220. A positive gate voltage should be applied to turn on the carrier channel 208 of this HEMT. This HMET is also called an enhanced-mode HEMT.

In conventional methods, a portion of the second III-V compound layer 206 may be etched to form a recess for an enhanced-mode HEMT by using other gases except the fluorine gas. However, the carrier channel 208 could not be normally-off completely under the recess, because the fluorine region would not be formed in such a process. Under those circumstances, there would remain residual carriers in a location which should be the depletion region 220 in the carrier channel 208. A threshold voltage of such a HEMT is hard to be adjusted from negative-polarity voltage supply to positive-polarity voltage supply. Hence, the capability of forming an enhanced-mode HEMT is limited.

Various embodiments of the present disclosure implement a fluorine gas for etching the recess 217B. After the recess 217B etching, the fluorine region 218 is formed in the second III-V compound layer 206. The fluorine region 218 may effectively deplete the electrons in the depletion region 220 of the carrier channel 208. The carrier channel 208 becomes normally-off because of the depletion region 220. The fluorine region 218 under the recess 217B eliminates the previous mentioned drawbacks in conventional methods.

In some embodiments, a remaining segment of the second III-V compound layer 206 after the recess 217B formation has a thickness $D_2$. A ratio of the thickness $D_1$ (the thickness of the second III-V compound layer 206) to the thickness $D_2$ to is in a range from about 2.5 to about 7. Out of this range, the fluorine region 218 may not effectively deplete the electrons in the depletion region 220 of the carrier channel 208, or the HEMT may suffer from low on-current issue.

Figure 2F:
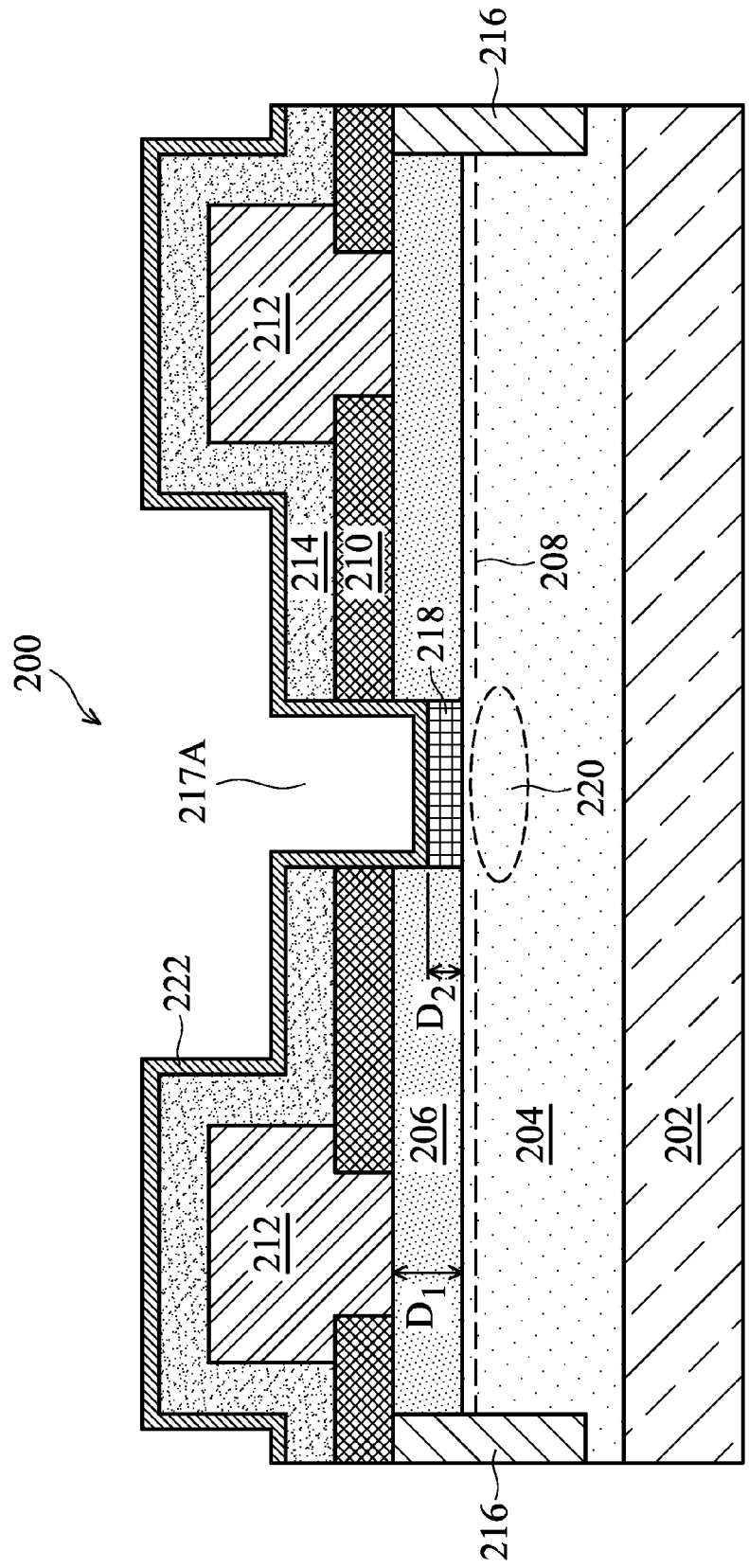

FIG. 2F illustrates a gate dielectric layer 222 is deposited over the semiconductor structure 200 shown in FIG. 2E. The gate dielectric layer 222 is deposited on the protection layer 214, along an interior surface of the opening 217A and the recess 217B, and on the exposed portion of the second III-V compound layer 206 (also the fluorine region 218). The gate dielectric layer 222 is also deposited over the source/drain features 212. The gate dielectric layer 222 is formed between the second III-V compound layer 206 and the later formed gate electrode. The gate dielectric layer 222 may increase the threshold voltage of this HEMT to a higher level and prevent a leakage current from the gate electrode to the second III-V compound layer 206. This HEMT could be operated a higher operation voltage for various applications.

In some embodiments, the gate dielectric layer 222 is in a thickness range from about 3 nm to about 50 nm. In some examples, the gate dielectric layer 222 comprises silicon oxide, silicon nitride, gallium oxide, aluminum oxide, scandium oxide, zirconium oxide, lanthanum oxide or hafnium oxide.

In at least one embodiment, the gate dielectric layer 222 is formed by an atomic layer deposition (ALD) method. The ALD method is based on the sequential use of a gas phase chemical process. The majority of ALD reactions use two chemicals, typically called precursors. These precursors react with a surface one-at-a-time in a sequential manner. By exposing the precursors to the growth surface repeatedly, the gate dielectric layer 222 is deposited. The ALD method provides an uniform thickness of the gate dielectric layer 222 with high quality. In one example, the gate dielectric layer 222 is zirconium oxide. In some embodiments, a first precursor includes tetrakis(ethylmethylamino) zirconium (TEMAZr) or zirconium chloride ($ZrCl_4$). In some embodiments, a second precursor includes oxygen in order to oxidize the first precursor material to form a monolayer. In some examples, the second precursor includes ozone ($O_3$), oxygen, water ($H_2O$), $N_2O$ or $H_2O$—$H_2O_2$. In other embodiments, the gate dielectric layer 222 is formed by a plasma enhanced chemical vapor deposition (PECVD) or a low pressure chemical vapor deposition (LPCVD).

In certain embodiments, the gate dielectric layer 222 is annealed after the deposition process in a temperature in a range from about 400° C. to about 700° C. The annealing process may recover from the possible damage on the second III-V compound layer 206 during the operation 106. Also, dangling bonds that form between the gate dielectric layer 222 and the second III-V compound layer 206 (e.g., as a result of the previous process steps) may be repaired.

Figure 2G:
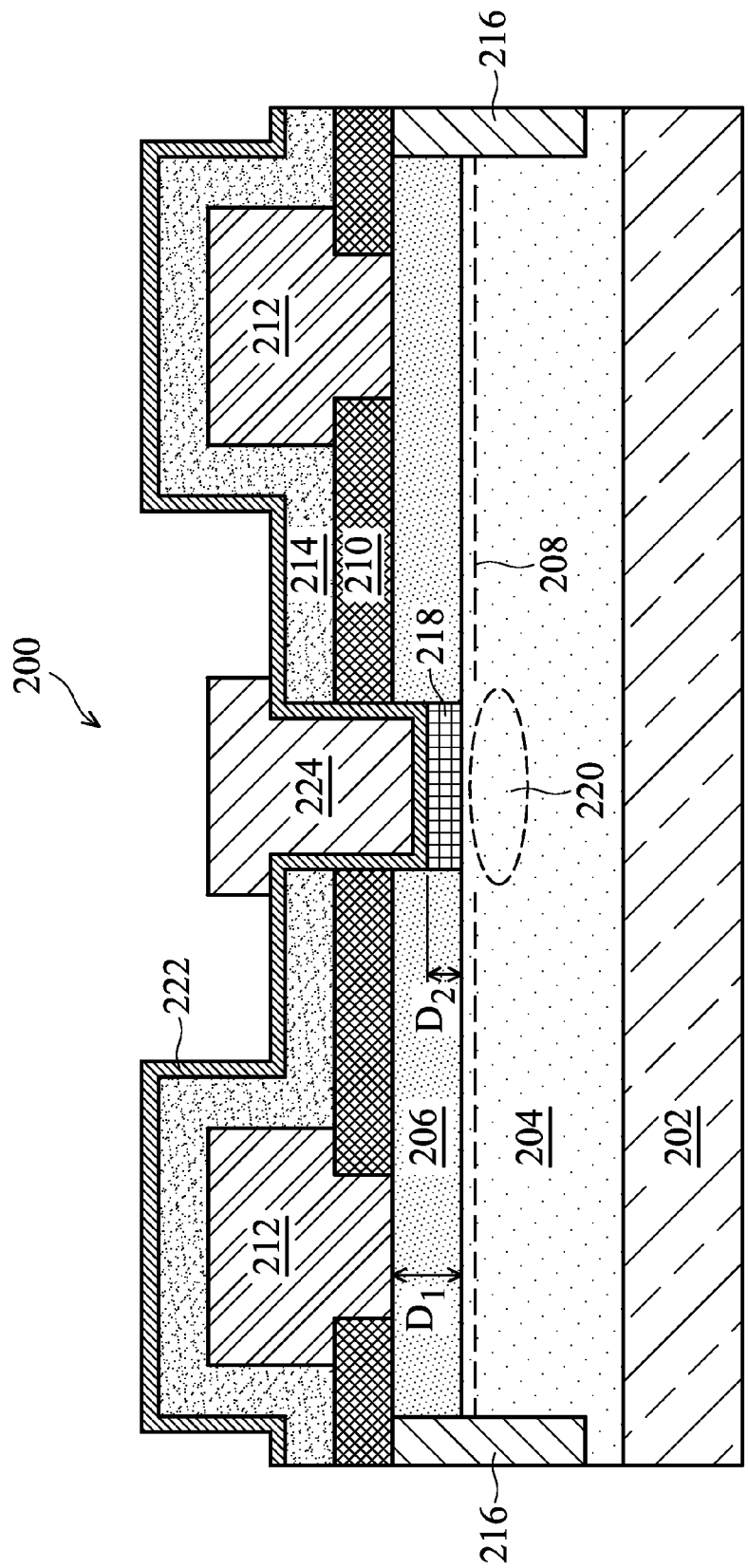

Referring back to FIG. 1, method 100 continues with operation 107. FIG. 2G illustrates a cross-sectional view of the semiconductor structure 200 after a gate electrode 224 is formed in the opening 217A and the recess 217B over the second III-V compound layer 206.

In FIG. 2G, the gate electrode 224 is formed over the fluorine region 218 on the gate dielectric layer 222. The gate electrode 224 is also overlying the depletion region 220 of the carrier channel 208. In one example, a gate electrode layer is deposited on the gate dielectric layer 22, and overfills the opening 217A and the recess 217B shown in FIG. 2F. Lithography and etching processes are performed on the gate electrode layer to define the gate electrode 224 between the source/drain features 212. In some embodiments, the gate electrode 224 includes a conductive material layer that includes a refractory metal or its compounds, e.g., titanium (Ti), titanium nitride (TiN), titanium tungsten (TiW) and tungsten (W). In another example, the gate electrode 224 includes nickel (Ni), gold (Au) or copper (Cu).

In the above described embodiments, the gate electrode 224, the source/drain features 212, and the carrier channel 208 in the first III-V compound layer 204 are configured as a transistor. When a voltage is applied to the gate electrode, a device current of the transistor could be modulated.

One aspect of the disclosure describes a semiconductor structure. The semiconductor structure includes a first III-V compound layer. A second III-V compound layer is disposed on the first III-V compound layer and is different from the first III-V compound layer in composition. The second III-V compound layer has a top surface. A source feature and a drain feature are disposed on the second III-V compound layer. A gate electrode is disposed over the second III-V compound layer between the source feature and the drain feature. A fluorine region is embedded in the second III-V compound layer under the gate electrode. The fluorine region has a top surface lower than the top surface of the second III-V compound layer. A gate dielectric layer is disposed under at least a portion of the gate electrode and over the fluorine region.

A further aspect of the disclosure describes a semiconductor structure. The semiconductor structure includes a GaN layer disposed on a substrate. An AlGaN layer is disposed on the GaN layer. The AlGaN layer has a top surface. A fluorine region is embedded in the AlGaN layer. The fluorine region has a top surface lower than the top surface of the AlGaN layer. A gate electrode is disposed over the fluorine region. The gate electrode has a bottom surface lower than the top surface of the AlGaN layer. A source feature and a drain feature disposed on opposite sides of the gate electrode on the AlGaN layer. The source feature and the drain feature comprise an intermetallic compound. A portion of a gate dielectric layer is disposed between the gate electrode and the AlGaN layer.

The present disclosure also describes an aspect of a method of forming a semiconductor structure. The method includes providing a first III-V compound layer. A second III-V compound layer is epitaxially grown on the first III-V compound layer. A dielectric cap layer is deposited on the second III-V compound layer. Two through holes are etched in the dielectric cap layer to expose a portion of the second III-V compound layer. A source feature and a drain feature are formed in the two through holes on the second III-V compound layer. An opening in the dielectric cap layer and a recess in the second III-V compound layer under the opening are etched with a fluorine gas. A gate electrode is formed in the opening and the recess over the second III-V compound layer.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A high electron mobility transistor (HEMT) comprising:
   a first III-V compound layer;
   a second III-V compound layer disposed on the first III-V compound layer and different from the first III-V compound layer in composition, the second III-V compound layer having a top surface;
   a source feature and a drain feature disposed on the second III-V compound layer;
   a gate electrode disposed over the second III-V compound layer between the source feature and the drain feature;
   a protection layer covering the source feature and the drain feature;
   a fluorine region embedded in the second III-V compound layer under the gate electrode, wherein the fluorine region has a top surface lower than the top surface of the second III-V compound layer; and
   a gate dielectric layer disposed under at least a portion of the gate electrode and over the fluorine region, wherein a portion of the gate dielectric layer is on the protection layer.

2. The HEMT of claim 1, wherein the second III-V compound layer has a thickness $D_1$ in a range from about 5 nm to about 50 nm.

3. The HEMT of claim 2, wherein the fluorine region is in a portion of the second III-V compound layer has a thickness $D_2$, wherein a ratio of $D_1/D_2$ is in a range from about 2.5 to about 7.

4. The HEMT of claim 1, wherein the gate dielectric layer comprises silicon oxide, silicon nitride, gallium oxide, aluminum oxide, scandium oxide, zirconium oxide, lanthanum oxide or hafnium oxide.

5. The HEMT of claim 1, wherein the fluorine region depletes a portion of a carrier channel located between the first III-V compound layer and the second III-V compound layer.

6. The HEMT of claim 1, wherein the gate electrode comprises titanium (Ti), titanium nitride (TiN), titanium tungsten (TiW), tungsten (W), nickel (Ni), gold (Au) or copper (Cu).

7. The HEMT of claim 1 further comprising a dielectric cap layer over the second III-V compound layer, wherein the source feature and the drain feature extend through the dielectric cap layer and contact the second III-V compound layer.

8. The HEMT of claim 1, wherein each of the source feature and the drain feature are free of Au and comprises Ti, Co, Ni, W, Pt, Ta, Pd, Mo, TiN, or AlCu alloy.

9. A high electron mobility transistor (HEMT) comprising:
   a gallium nitride (GaN) layer disposed on a substrate;
   an aluminum gallium nitride (AlGaN) layer disposed on the GaN layer, the AlGaN layer having a top surface;
   a fluorine region embedded in the AlGaN layer, wherein the fluorine region has a top surface lower than the top surface of the AlGaN layer;
   a gate electrode disposed over the fluorine region, wherein the gate electrode has a bottom surface lower than the top surface of the AlGaN layer;
   a source feature and a drain feature disposed on opposite sides of the gate electrode on the AlGaN layer, wherein the source feature and the drain feature comprise an intermetallic compound;
   a dielectric cap layer over the AlGaN layer, wherein the source feature and the drain feature extend through the dielectric cap layer and contact the AlGaN layer;

a gate dielectric layer disposed between the gate electrode and the AlGaN layer; and a protection layer covering the source feature and the drain feature, wherein the gate electrode extends through the protection layer.

10. The HEMT of claim 9, wherein a carrier channel is located near an interface between the GaN layer and the AlGaN layer, the carrier channel comprising a depletion region under the gate electrode.

11. The HEMT of claim 9, wherein the AlGaN layer has a thickness $D_1$ in a range from about 5 nm to about 50 nm.

12. The HEMT of claim 9, wherein the fluorine region has a thickness D2, wherein a ratio of D1/D2 is in a range from about 2.5 to about 7.

13. The HEMT of claim 9, wherein each of the source feature and the drain feature are free of Au and comprises Ti, Co, Ni, W, Pt, Ta, Pd, Mo, TiN, or AlCu alloy.

14. A high electron mobility transistor (HEMT) comprising:
- a substrate;
- a first III-V compound layer on said substrate;
- a second III-V compound layer on said first III-V compound layer and different from the first III-V compound layer in composition, the second III-V compound layer having a top surface;
- a dielectric cap layer on said second III-V compound layer, a first and a second opening extending through the dielectric cap layer and exposing a first and a second region of the second III-V compound layer, respectively;
- a third opening extending through the dielectric cap and further extending partially into the second III-V compound layer;
- a source feature and a drain feature within the first and second openings, respectively;
- a gate electrode within the third opening, wherein a ratio of a thickness of the second III-V compound layer below the source feature to a thickness of the second III-V compound layer below the gate electrode is in a range from about 2.5 to about 7;
- a fluorine region embedded in the second III-V compound layer under the gate electrode; and
- a gate dielectric layer disposed under at least a portion of the gate electrode and over the fluorine region.

15. The HEMT of claim 14, wherein both the first and the second III-V compound layer include a compound of gallium.

16. The HEMT of claim 14, wherein the second III-V compound layer has a thickness in a range of from about 5 nm to about 50 nm below the first opening.

17. The HEMT of claim 14 wherein the first III-V compound layer comprises a material selected from the group consisting essentially of GaN, GaAs, InP, and combinations thereof.

18. The HEMT of claim 14 further comprising a protection layer covering the dielectric cap layer and the source and drain features, the gate electrode extending through the dielectric cap layer and the protection layer.

* * * * *

UNITED STATES PATENT AND TRADEMARK OFFICE
CERTIFICATE OF CORRECTION

| | |
|---|---|
| PATENT NO. | : 8,624,296 B1 |
| APPLICATION NO. | : 13/571136 |
| DATED | : January 7, 2014 |
| INVENTOR(S) | : King-Yuen Wong et al. |

It is certified that error appears in the above-identified patent and that said Letters Patent is hereby corrected as shown below:

On the Title Page, item (54), and in the Specification, Col. 1, line 2, Title, delete "Flourine" and insert --Fluorine--.

Signed and Sealed this
Second Day of June, 2015

Michelle K. Lee
*Director of the United States Patent and Trademark Office*